(12) United States Patent
Hashimoto et al.

(10) Patent No.: US 8,400,770 B2
(45) Date of Patent: Mar. 19, 2013

(54) HEAT SPREADER, ELECTRONIC APPARATUS, AND HEAT SPREADER MANUFACTURING METHOD

(75) Inventors: Mitsuo Hashimoto, Kanagawa (JP); Kazuaki Yazawa, Tokyo (JP); Yuichi Ishida, Kanagawa (JP); Hiroyuki Ryoson, Kanagawa (JP)

(73) Assignee: Sony Corporation, Tokyo (JP)

( * ) Notice: Subject to any disclaimer, the term of this patent is extended or adjusted under 35 U.S.C. 154(b) by 189 days.

(21) Appl. No.: 12/552,794

(22) Filed: Sep. 2, 2009

(65) Prior Publication Data

US 2010/0053899 A1 Mar. 4, 2010

(30) Foreign Application Priority Data

Sep. 2, 2008 (JP) ................. 2008-224363

(51) Int. Cl.
*H05K 7/20* (2006.01)
*F28F 7/00* (2006.01)
*F28D 15/02* (2006.01)
*B21D 53/02* (2006.01)

(52) U.S. Cl. ........ 361/700; 361/698; 361/699; 361/701; 361/702; 361/709; 361/710; 361/711

(58) Field of Classification Search .......... 361/709–711, 361/698–702
See application file for complete search history.

(56) References Cited

U.S. PATENT DOCUMENTS

| | | | | |
|---|---|---|---|---|
| 6,407,922 B1* | 6/2002 | Eckblad et al. | | 361/704 |
| 6,947,285 B2* | 9/2005 | Chen et al. | | 361/708 |
| 7,200,006 B2* | 4/2007 | Farrow et al. | | 361/704 |
| 7,213,637 B2* | 5/2007 | Lin et al. | | 165/104.26 |
| 7,440,280 B2* | 10/2008 | Shuy | | 361/701 |
| 7,679,916 B2* | 3/2010 | Orr et al. | | 361/719 |
| 2005/0126766 A1* | 6/2005 | Lee et al. | | 165/133 |
| 2006/0262571 A1* | 11/2006 | Chen | | 362/632 |
| 2006/0291168 A1* | 12/2006 | Lee | | 361/701 |
| 2007/0053168 A1* | 3/2007 | Sayir et al. | | 361/718 |
| 2007/0058052 A1 | 3/2007 | Makela | | |
| 2007/0126116 A1* | 6/2007 | Dangelo et al. | | 257/720 |
| 2007/0284089 A1* | 12/2007 | Vadakkanmaruveedu et al. | | 165/104.26 |
| 2008/0137307 A1* | 6/2008 | Orr et al. | | 361/719 |
| 2008/0225489 A1* | 9/2008 | Cai et al. | | 361/704 |
| 2009/0059535 A1* | 3/2009 | Kim et al. | | 361/710 |
| 2009/0166014 A1* | 7/2009 | Chang et al. | | 165/133 |
| 2011/0103020 A1* | 5/2011 | Dangelo et al. | | 361/709 |

FOREIGN PATENT DOCUMENTS

| | | |
|---|---|---|
| JP | 11-183067 | 7/1999 |
| JP | 11-287578 | 10/1999 |
| JP | 2004-028442 | 1/2004 |
| JP | 2004-238672 | 8/2004 |
| WO | 2008/079430 | 7/2008 |

* cited by examiner

*Primary Examiner* — Anatoly Vortman
(74) *Attorney, Agent, or Firm* — K&L Gates, LLP

(57) ABSTRACT

According to an embodiment, there is provided a heat spreader including a condenser portion formed of a nanomaterial. The heat spreader further includes a first plate member, a second plate member, and a support portion. The first plate member includes a first surface, the first surface including a first area provided with the condenser portion. The second plate member includes a second surface and is arranged such that the second surface faces the first surface. The support portion protrudes from the first area of the first plate member to the second plate member, and has an end portion that is free from the nanomaterial and is in contact with the second surface of the second plate member.

17 Claims, 11 Drawing Sheets

Dependence on CNT length

Dependence on CNT density

HEAT SPREADER, ELECTRONIC APPARATUS, AND HEAT SPREADER MANUFACTURING METHOD

CROSS REFERENCES TO RELATED APPLICATIONS

The present application claims priority to Japanese Priority Patent Application JP 2008-224363 filed in the Japan Patent Office on Sep. 2, 2008, the entire content of which is hereby incorporated by reference.

BACKGROUND

The present application relates to a heat spreader thermally connected to a heat source of an electronic apparatus, an electronic apparatus including the heat spreader, and a heat spreader manufacturing method.

In the past, a heat spreader has been used as a device thermally connected to a heat source of an electronic apparatus, such as a CPU (Central Processing Unit) of a PC (Personal Computer), to absorb and diffuse heat of the heat source. As the heat spreader, a solid-type metal heat spreader made of for example a copper plate is known, and a phase-transition-type heat spreader including an evaporation portion and a working fluid has been proposed recently.

In the phase-translation-type heat spreader, the working fluid evaporates in the evaporation portion that receives heat from a heat source, and the evaporated working fluid condenses and flows in a flow path to return to the evaporation portion. By repeating the above operation, the heat of the heat source is diffused (see, for example, United States Patent Application Publication No. 2007/0158052; paragraph 0032, FIG. 4, hereinafter referred to as Patent Document 1).

SUMMARY

In general, it is known that as a surface area of a condenser portion being in contact with a working fluid is larger, condensation of the working fluid is enhanced. Thus, in the heat spreader, in order to improve condensation efficiency of the working fluid, the surface area of the condenser portion should be made larger. However, while an electronic apparatus mounted with such a device is required to enhance the condensation efficiency of the device, the electronic apparatus itself is required to be downsized. Accordingly, in such a device, enlarging the surface area of the condenser portion goes against downsizing.

In view of the above-mentioned circumstances, it is desirable to provide a heat spreader enabling a higher condensation efficiency without being made larger, and an electronic apparatus including the heat spreader.

It is further desirable to provide a heat spreader manufacturing method that realizes easier manufacture with higher reliability.

According to an embodiment, there is provided a heat spreader including a condenser portion formed of a nanomaterial.

According to the embodiment, because the nanomaterial has a nanostructure on a surface, the condenser portion having a large surface area can be realized. Accordingly, the heat spreader with a higher condensation efficiency is obtained without making the condenser portion larger.

The heat spreader according to the embodiment may further include a first plate member, a second plate member, and a support portion. The first plate member includes a first surface, the first surface including a first area provided with the condenser portion. The second plate member includes a second surface and is arranged such that the second surface faces the first surface. The support portion protrudes from the first area of the first plate member to the second plate member, and has an end portion that is free from the nanomaterial and is in contact with the second surface of the second plate member.

According to the embodiment, the provision of the support portion increases structural strength of the heat spreader including the two plate members facing with each other. The end portion of the support portion protruding from the first plate member contacts the second plate member, and the end portion is free from the nanomaterial. Accordingly, the contact property of the end portion of the support portion and the second plate member is improved, and thus the structural strength of the heat spreader can be further increased.

The heat spreader according to the embodiment, may further include an evaporation portion formed of a nanomaterial. The second surface of the second plate member has a second area and a third area, the second area being provided with the evaporation portion, the third area excluding the second area. The end portion of the support portion is in contact with the third area of the second surface.

According to the embodiment, the evaporation portion is formed of the nanomaterial. Because the nanomaterial has the nanostructure on the surface, the evaporation portion having a large surface area can be realized. The evaporation portion formed of the nanomaterial is not provided in an area of the second plate member, the area being in contact with the end portion of the support member. Accordingly, the contact property of the end portion of the support portion and the second plate member is improved, and thus the structural strength of the heat spreader can be further increased.

In the heat spreader according to the embodiment, the first plate member is arranged in a first position. The second plate member is arranged in a second position that is lower than the first position. The nanomaterial forming the condenser portion is carbon nanotube having a tip end portion facing the second plate member.

According to the embodiment, the condenser portion is arranged higher than the evaporation portion. Thus, a working fluid condensed in the condenser portion can flow to the evaporation portion by gravity. The nanomaterial forming the condenser portion is carbon nanotube. The carbon nanotube has a high orientation. With the orientation, the carbon nanotube is produced such that the tip end portion faces downward. Accordingly, the flow efficiency of the working fluid by gravity can be further enhanced.

According to an embodiment, there is provided an electronic apparatus including a heat source and a heat spreader. The heat spreader is thermally connected to the heat source and includes a condenser portion formed of a nanomaterial.

According to the embodiment, in the heat spreader, because the nanomaterial has a nanostructure on a surface, the condenser portion having a large surface area can be realized. Accordingly, the heat spreader with a higher condensation efficiency is obtained without making the condenser portion larger.

According to the embodiment, the heat source is thermally connected to the heat spreader. Thus, the heat spreader can efficiently diffuse heat of the heat source.

In the electronic apparatus according to the embodiment, the heat spreader further includes a first plate member, a second plate member, and a support portion. The first plate member includes a first surface, the first surface including a first area provided with the condenser portion. The second plate member includes a second surface and is arranged such that the second surface faces the first surface. The support portion protrudes from the first area of the first plate member to the second plate member, and has an end portion that is free from the nanomaterial and is in contact with the second surface of the second plate member.

According to the embodiment, in the heat spreader, the provision of the support portion increases structural strength of the heat spreader including the two plate members facing with each other. The end portion of the support portion protruding from the first plate member contacts the second plate member, and the end portion is free from the nanomaterial. Accordingly, the contact property of the end portion of the support portion and the second plate member is improved, and thus the structural strength of the heat spreader can be further increased.

According to the embodiment, the heat source is thermally connected to the heat spreader. Thus, the heat spreader can efficiently diffuse heat of the heat source.

According to an embodiment, there is provided a heat spreader manufacturing method including preparing a first plate member having a first area provided with a protrusion portion, producing a nanomaterial in the first area provided with the protrusion portion, removing the nanomaterial that has produced in an end portion of the protrusion portion, and causing the end portion of the protrusion portion to contact with a second area of a second plate member.

According to the embodiment, the nanomaterial is produced in the first area of the first plate member, and the nanomaterial that has produced in the end portion of the protrusion portion is removed. Accordingly, the contact property of the end portion of the protrusion portion and the second plate member is improved, and thus the structural strength of the heat spreader can be further increased. The heat spreader manufacturing method can thus realize easier manufacture with higher reliability.

The heat spreader manufacturing method according to the embodiment may further include producing a nanomaterial in a third area of a surface of the second plate member, the surface being in contact with the end portion of the protrusion portion, the third area excluding the second area of the surface.

According to the embodiment, the area of the second plate member that is in contact with the end portion of the protrusion portion is free from the nanomaterial. Accordingly, the contact property of the end portion of the protrusion portion and the second plate member is improved, and thus the structural strength of the heat spreader can be further increased. The heat spreader manufacturing method can thus realize easier manufacture with higher reliability.

In the heat spreader manufacturing method according to the embodiment, the nanomaterial is carbon nanotube. The first plate member is arranged in a first position. The second plate member is arranged in a second position lower than the first position. The carbon nanotube is produced such that a tip end portion of the carbon nanotube faces the second plate member.

According to the embodiment, the nanomaterial forming the condenser portion is carbon nanotube. The carbon nanotube has a high orientation. With the orientation, the carbon nanotube can be produced such that the tip end portion faces downward. The heat spreader manufacturing method can thus realize easier manufacture with higher reliability.

As described above, the heat spreader according to an embodiment can realize a higher condensation efficiency without making the heat spreader larger.

The heat spreader manufacturing method according an embodiment can realize easier manufacture with higher reliability.

Additional features and advantages are described herein, and will be apparent from the following Detailed Description and the figures.

DETAILED DESCRIPTION

The present application will be described with reference to the drawings according to an embodiment.

(Structure of Heat Spreader)

Figure 1:
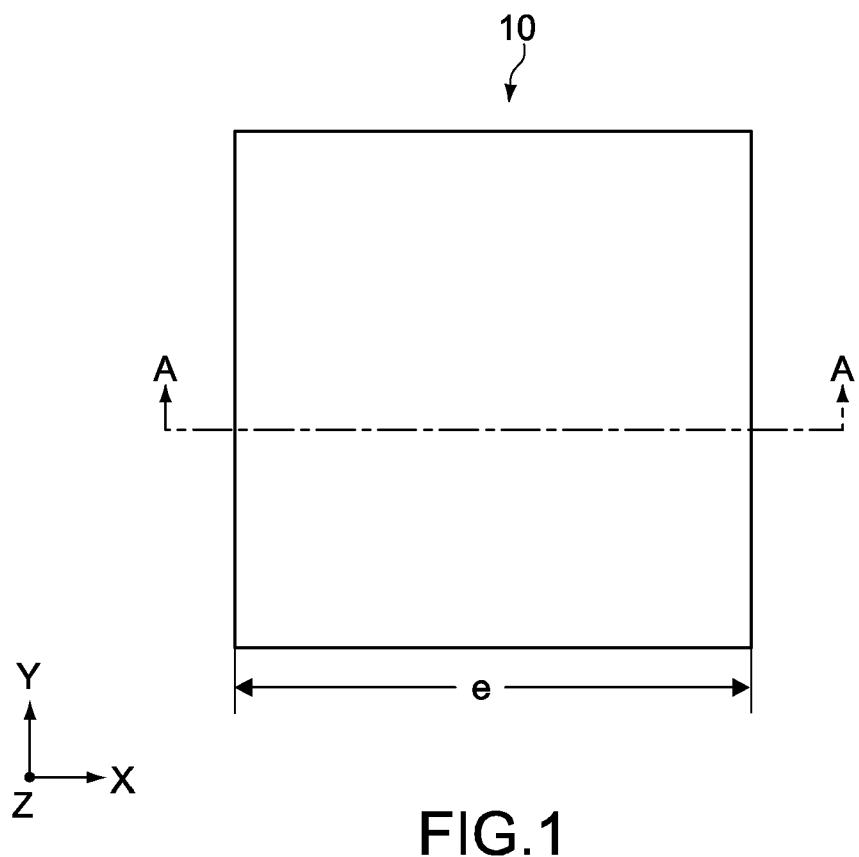
FIG. 1 is a plan view of a heat spreader according to an embodiment.
Figure 2:
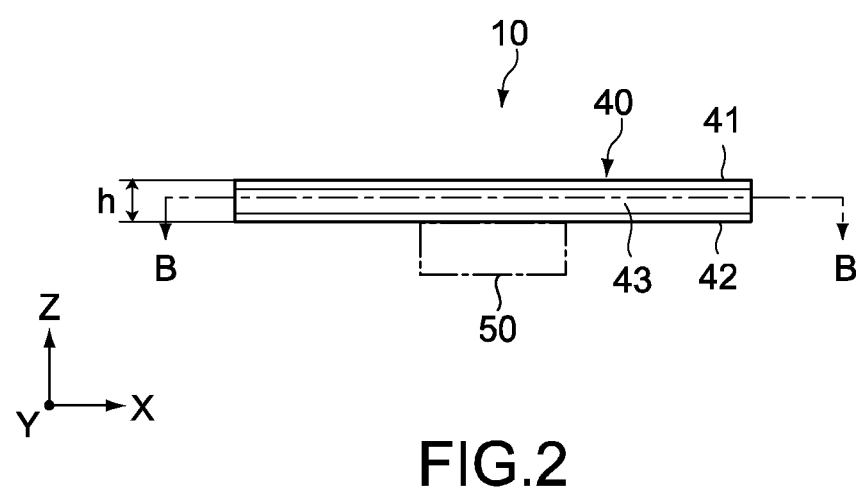
FIG. 2 is a side view of the heat spreader of FIG. 1.
Figure 3:
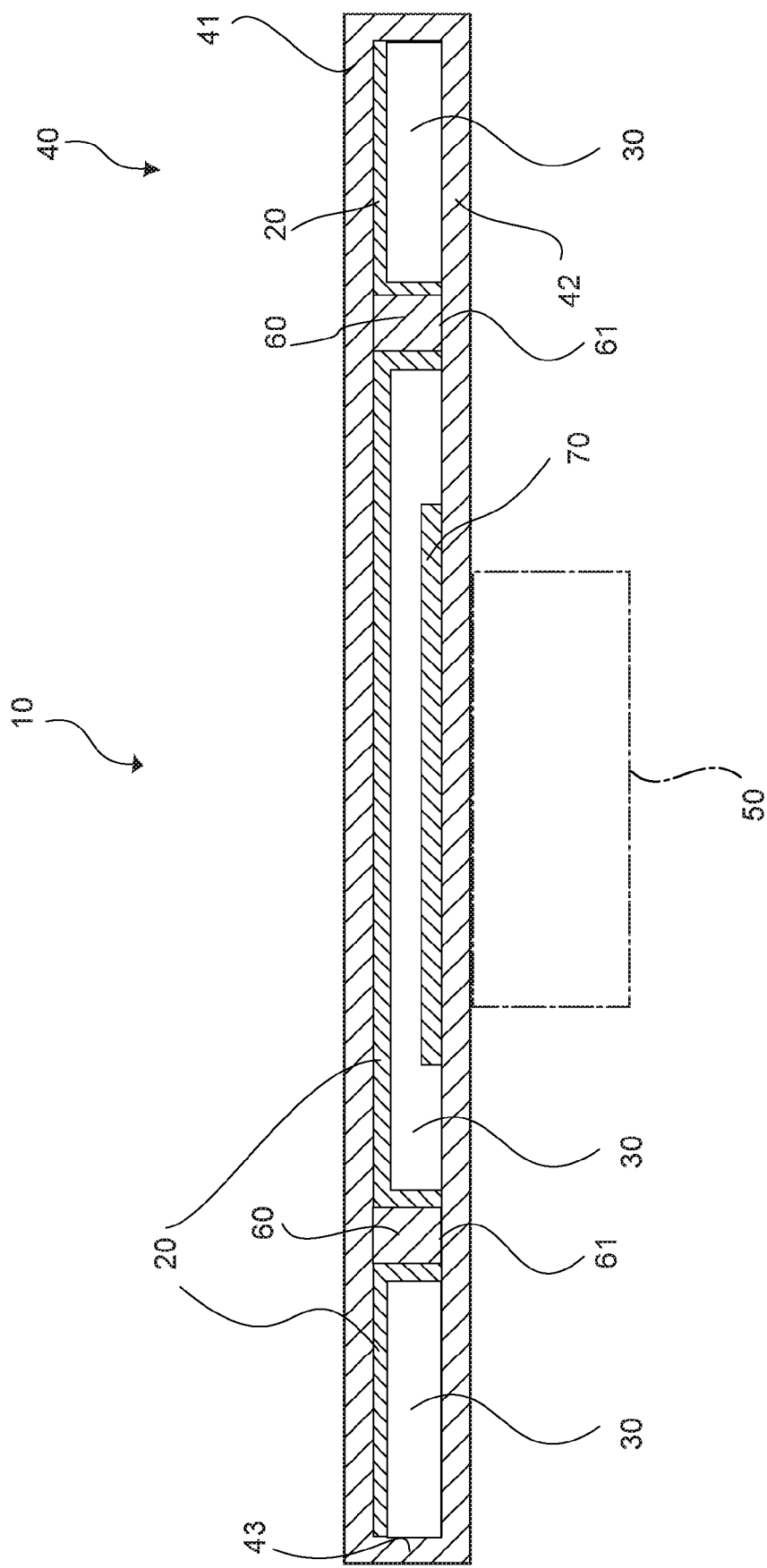
FIG. 3 is a longitudinal sectional view of the heat spreader of FIG. 1, seen from the A-A line of FIG. 1.
Figure 4:
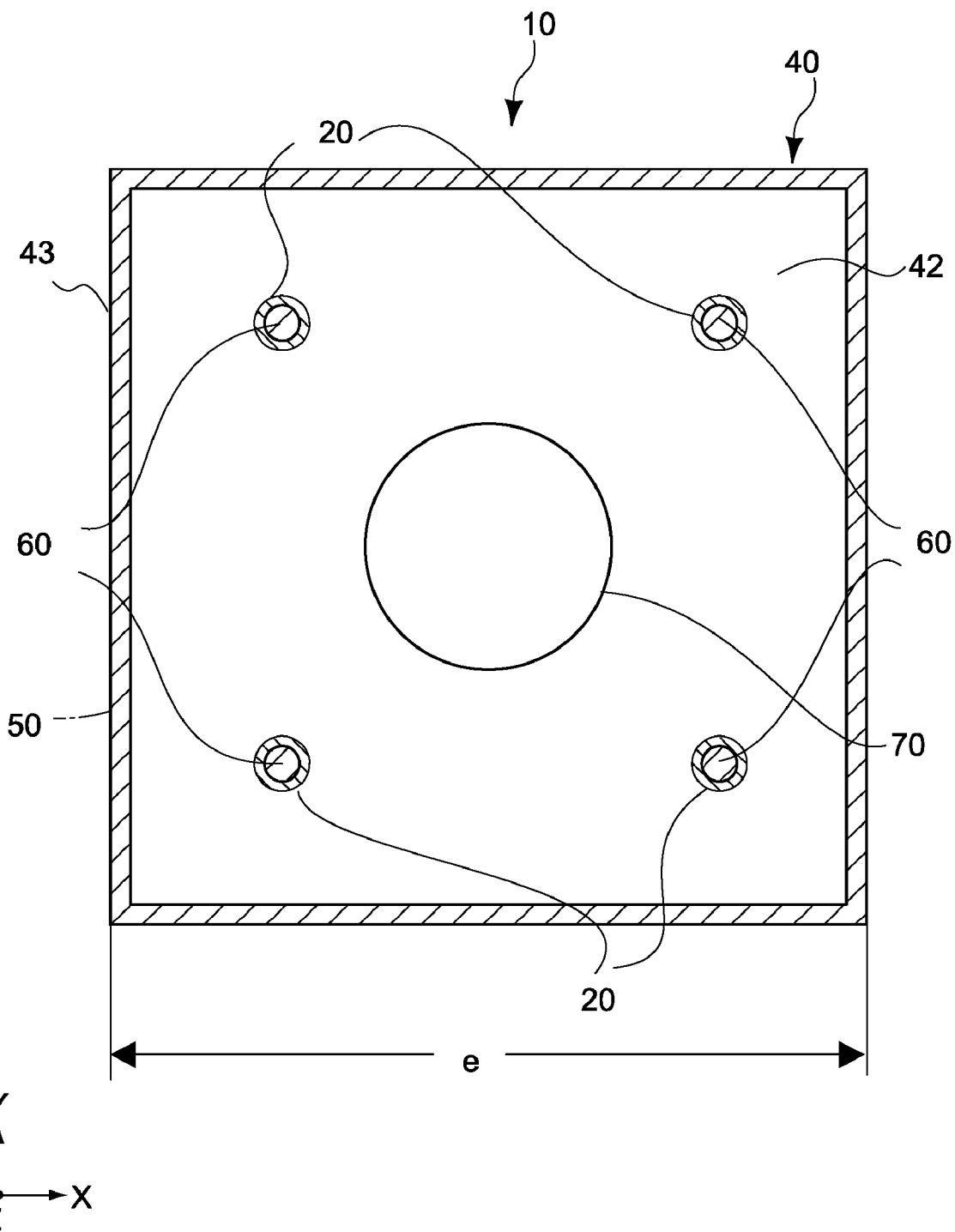
FIG. 4 is a sectional view of the heat spreader, seen from the B-B line of FIG. 2.

FIG. 1 is a plan view of a heat spreader according to an embodiment. FIG. 2 is a side view of the heat spreader of FIG. 1. FIG. 3 is a longitudinal sectional view of the heat spreader of FIG. 1, seen from the A-A line of FIG. 1. FIG. 4 is a sectional view of the heat spreader, seen from the B-B line of FIG. 2.

As shown in FIGS. 1-4, a heat spreader 10 includes a thin rectangular case 40. The case 40 includes therein a condenser portion 20, an evaporation portion 70, a flow path 30, and column portions 60. The case 40 further includes a not-shown working fluid (hereinafter referred to as refrigerant), sealed therein.

The case 40 includes a condensation side plate member 41 (first plate member), an evaporation side plate member 42 (second plate member) facing the condensation side plate member 41, and a side plate member 43. The condensation side plate member 41 corresponds to a condensation side of the heat spreader 10. The evaporation side plate member 42 corresponds to an evaporation side of the heat spreader 10. The condensation side plate member 41 is arranged higher than the evaporation side plate member 42. Specifically, the condensation side plate member 41 is arranged above the evaporation side plate member 42 with the flow path 30 arranged therebetween.

The case 40 is for example made of a metal material. The metal material is for example, copper, stainless steel, or aluminum, but not limited to the above. Other than the metal, a material having a high thermal conductance such as carbon may be employed. All of the condensation side plate member 41, the evaporation side plate member 42, and the side plate member 43 may be formed of different materials respectively, some of them may be formed of the same material, or all of them may be made of the same material. The condensation side plate member 41, the evaporation side plate member 42, and the side plate member 43 may be bonded by brazing, that is, welded, or may be bonded with an adhesive material depending on the materials.

The evaporation side plate member 42 is thermally connected with a heat source 50. The phrase thermally connected means, in addition to direct connection, connection via a thermal conductor, for example. The heat source 50 is, for example, an electronic component such as a CPU, a resistor, or another device that generates heat.

The condensation side plate member 41 includes the column portions 60 (support portion, protrusion portion). The column portions 60 are formed on a surface (first surface) of the condensation side plate member 41 facing the evaporation side plate member 42, and protrude to the evaporation side plate member 42. Each column portion 60 has an end portion 61 contacting a surface (second surface) of the evaporation side plate member 42 facing the condensation side plate member 41. The column portions 60 increase the structural strength of the heat spreader 10 having the condensation side plate member 41 and the evaporation side plate member 42. In the drawings, four column portions 60 each having a circular section are provided, but not limited to the above. The column portion 60 may have an arbitrary section such as rectangular, oval, or polygonal, and the number of the column portions 60 may be arbitrarily chosen.

The column portions 60 are made of for example a metal material. The metal material is for example, copper, stainless steel, or aluminum, but not limited to the above. Other than the metal, a material having a high thermal conductance such as carbon may be employed. The column portions 60 may be in advance formed with the condensation side plate member 41 as an integrated member. Alternatively, the column portions 60 and the condensation side plate member 41 may be separately formed and then bonded by brazing, that is, welded, or may be bonded with an adhesive material depending on the materials.

The condenser portion 20 is formed on the surface of the condensation side plate member 41 facing the evaporation side plate member 42 and side surfaces of the column potions 60. The condenser portion 20 is made of a nanomaterial. The nanomaterial is for example, carbon nanotube, but not limited to the above. The carbon nanotube is produced such that the tip end portion faces downward (in the vertical direction). The carbon nanotube has hydrophobicity. The surface of the condenser portion 20 may be subjected to a hydrophilic processing, as necessary, in accordance with a refrigerant to be used. The condenser portion 20 is for example formed on a region of the condensation side plate member 41 except the region bonded to the side plate member 43, and on the side surfaces of the column portions 60. Accordingly, the condenser portion 20 having a larger surface area can be formed, and the condensation efficiency is improved. The carbon nanotube has approximately 10 times higher thermal conductance than copper, a typical metal material of a metal heat spreader, for example. Accordingly, in a case of forming the condenser portion 20 made of carbon nanotube, an extremely improved condensation efficiency is obtained compared to a condenser side made of only the condensation side plate member 41 made of a metal material such as copper.

The evaporation portion 70 is formed on the surface (second surface) of the evaporation side plate member 42 facing the condensation side plate member 41. The evaporation portion 70 is formed in an arbitrary area where the column portions 60 are not provided. For example, the evaporation portion 70 is formed approximately in the center portion of the evaporation side plate member 42. The evaporation portion 70 is made of a nanomaterial. The nanomaterial has a nanostructure on the surface, so, compared to a case where the evaporation side is made of only the evaporation side plate member 42 made of a metal material or the like, the surface area of the evaporation side increases and thus the evaporation efficiency improves. The nanomaterial is for example, carbon nanotube, but not limited to the above. The surface of the evaporation portion 70 may be subjected to a hydrophilic processing, as necessary. Accordingly, in a case of forming the evaporation portion 70 made of carbon nanotube, an extremely improved evaporation efficiency is obtained compared to an evaporation side made of only the evaporation side plate member 42 made of a metal material such as copper.

The evaporation portion 70 is formed approximately in the center portion of the evaporation side plate member 42. The above-mentioned area corresponds to the heat source 50 thermally connected to the evaporation side plate member 42. By forming the evaporation portion 70 in the area corresponding to the heat source 50, that is, the area where the heat from the heat source 50 concentrates, the evaporation efficiency of the refrigerant can be increased.

The flow path 30 is an area defined by the condenser portion 20, the evaporation portion 70, the evaporation side plate member 42, and the side plate member 43. The flow path 30 is a flow path for the refrigerant between the condenser portion 20 and the evaporation portion 70 and evaporation side plate member 42.

The heat spreader 10 of this embodiment is 30-50 mm length (e) on each side in plan view and 2-5 mm height (h), for example. The heat spreader 10 having such a size is for a CPU of a PC as the heat source 50, thermally connected to the heat spreader 10. The size of the heat spreader 10 may be defined as necessary in accordance with the size of the heat source 50. For example, in a case where the heat source 50 thermally connected to the heat spreader 10 is a heat source of a large-sized display or the like, the length e may be set to about 600 mm. The size of the heat spreader 10 is defined such that the refrigerant can flow and condense appropriately. In addition, the shape of the heat spreader 10 is not limited to the rectangular shape as shown in this embodiment. The operating temperature range of the heat spreader 10 is, for example, from −40 degrees to +200 degrees, approximately. The endothermic density of the heat spreader 10 is for example 8 W/mm2 or lower.

As the refrigerant, pure water, alcohol such as ethanol, methanol, or isopropyl alcohol, chlorofluorocarbon, hydrochlorofluorocarbon, fluorine, ammonia, acetone, or the like may be used, but not limited to the above. Meanwhile, in view of latent heat or preserve of the global environment, pure water may be preferable.

Note that in the drawings, in order for easily understanding, the shape of the members in the case 40 is changed from the actual configuration. For example, the scale ratio of the condenser portion 20, the evaporation portion 70, the column portions 60, and the like with respect to the case 40 is made larger than the actual configuration.

Figure 5:
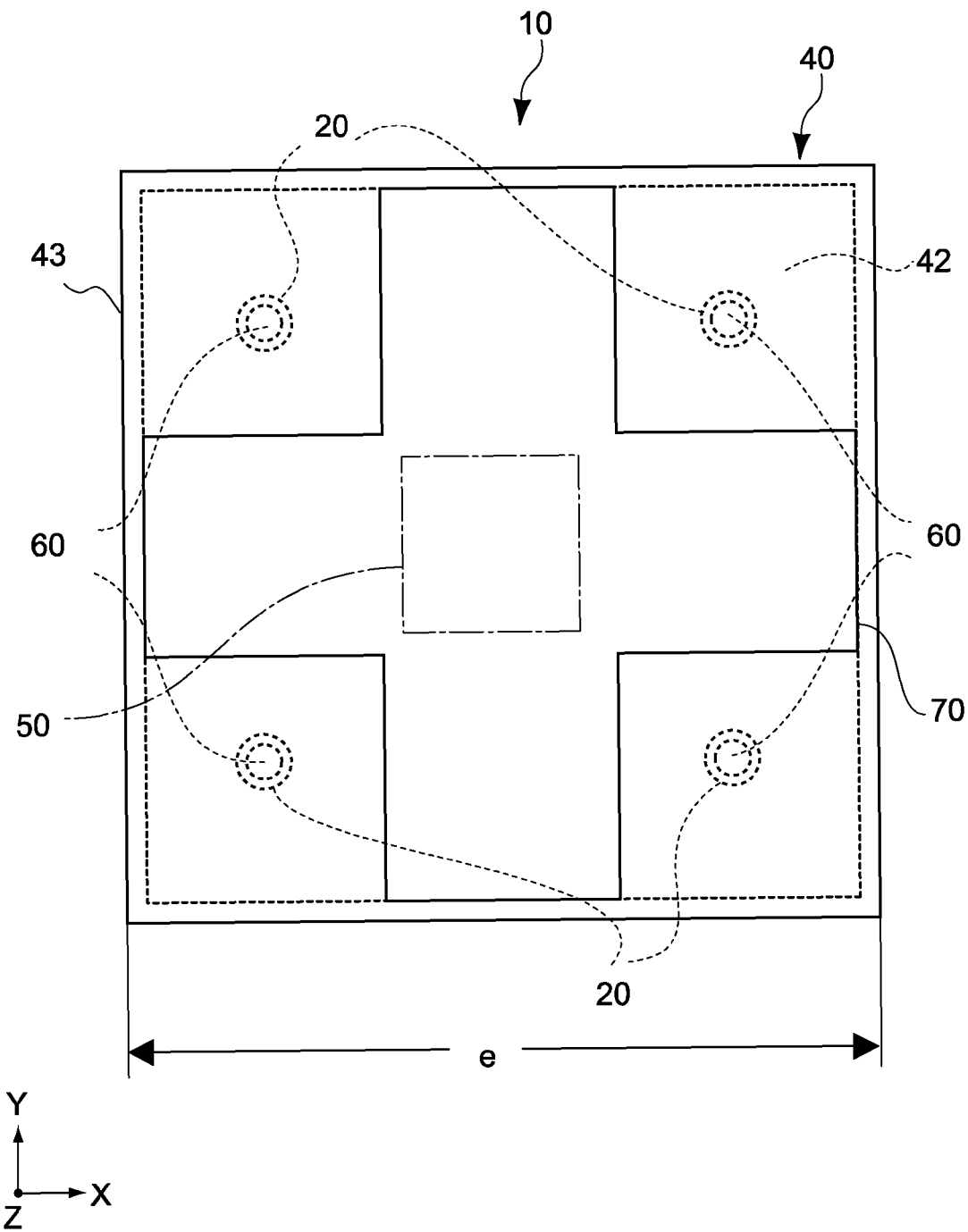
FIG. 5 is a plan view showing an evaporation portion of the heat spreader, having a different shape.

FIG. 5 is a plan view exemplarily showing an evaporation portion having a different shape.

As shown in FIG. 5, an evaporation portion 70 is made in a crisscross shape including the center portion of the evaporation side plate member 42. By forming the evaporation portion 70 in the area corresponding to the heat source 50 and in another area, the surface area of the evaporation portion 70 can be made larger and accordingly the evaporation efficiency of the refrigerant further can improve. The area in which the evaporation portion 70 is formed excludes the areas where the column portions 60 are provided. Since the evaporation portion 70 is not formed in the area where the column portions 60 are provided, the contact property of the column portions 60 and the evaporation side plate member 42 is not deteriorated and the structural strength of the heat spreader 10 can be increased.

In view of the contact property, in the case where the evaporation portion 70 is formed on the evaporation side plate member 42, the evaporation portion 70 may be formed in any area except for the contact area where end portions 61 of the column portions 60 are provided. Some of the reasons therefor are as follows. The nanomaterial forming the evaporation portion 70 has the nanostructure on the surface. Thus, the contact property of a nanomaterial layer and a metal plate is lower than the contact property of metal plates bonded to each other. In addition, in view of the evaporation property, the evaporation portion 70 may be formed in the area including the area corresponding to the heat source 50.

(Operation of Heat Spreader)

Figure 6:
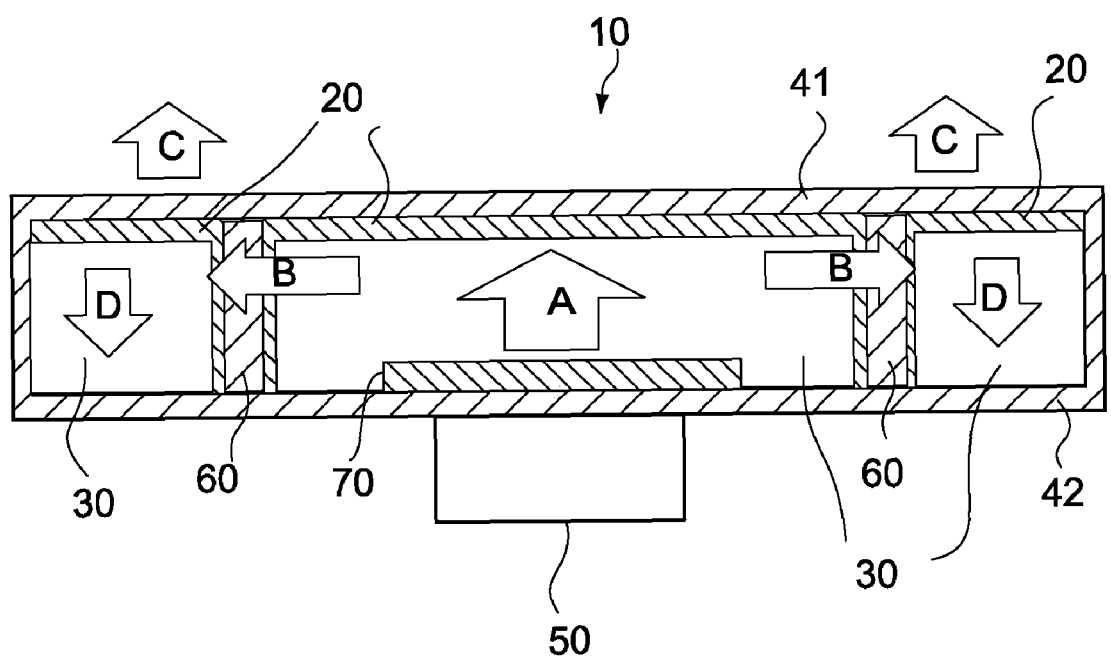
FIG. 6 is a schematic diagram showing an operation of the heat spreader.

The operation of the heat spreader 10 as structured above will be described. FIG. 6 is a schematic diagram showing the operation.

When the heat source 50 generates heat, the heat is transferred to the inside of the case 40 via the evaporation side plate member 42. Then, a liquid-phase refrigerant (hereinafter referred to as liquid refrigerant) on the evaporation portion 70 and the evaporation side plate member 42 evaporates to be a gas-phase refrigerant (hereinafter referred to as gas refrigerant).

The gas refrigerant flows in the flow path 30 toward the condenser portion 20 (arrow A). As the gas refrigerant flows in the flow path 30, the heat diffuses, and the gas refrigerant condenses in the condenser portion 20 to be the liquid phase (arrow B). Thus, the heat spreader 10 radiates the heat (arrow C). The liquid refrigerant flows in the flow path 30 to return to the evaporation side plate member 42 (arrow D).

By repeating the above operation, the heat of the heat source 50 is diffused by the heat spreader 10.

The operational zones as shown by the arrows A to D in FIG. 6 are merely rough guide or rough standard, and not clearly defined since the respective operational zones may be shifted according to the amount of heat generated by the heat source 50 or the like.

Condensation of the liquid refrigerant in the condensation portion 20 as shown by the arrow B will be described.

The condensation portion 20 is made of a nanomaterial such as carbon nanotube, and has a nanostructure on the surface. That is, the surface area of the condensation portion 20 is larger than the condensation side plate member 41 provided with no condensation portion 20. The surface of the condenser portion 20 is subjected to a hydrophilic processing, as necessary. Thus, the liquid refrigerant can permeate the minute nanostructure. In the case where the nanomaterial is carbon nanotube having a high thermal conductance, the carbon nanotube can transfer latent heat of the liquid refrigerant permeated into the minute nanostructure efficiently. Thus, since the condenser portion 20 has a large surface area, hydrophilicity, and a high thermal conductance, the condensation efficiency can be improved.

Flow of the liquid refrigerant in the flow path 30 as shown by the arrow D will be described.

The liquid refrigerant condensed in the condenser portion 20 flows in the flow path 30 by gravity, and returns to the evaporation side plate member 42. The carbon nanotube forming the condenser portion 20 is produced such that the tip end portion faces downward. The liquid refrigerant flows on the carbon nanotube having the tip end portion facing downward and then flows in the flow path 30. This structure facilitates the flow by gravity. Since the condensed liquid refrigerant flows on the surface of the carbon nanotube downward, and then immediately flows in the flow path 30, the condensation of the gas refrigerant that newly reaches the condenser portion 20 is not hindered by the condensed liquid refrigerant.

Accordingly, the fear of decreasing the supply amount of the liquid refrigerant to the evaporation side plate member 42 is decreased, the circulation of the refrigerant is not adversely affected, and the operation stability can be realized.

It should be noted that, to the surface of the condensation side plate member 41 of the heat spreader 10, a not-shown heat radiation member such as a heat sink may be thermally connected. In this case, the heat diffused by the heat spreader 10 is transferred to the heat sink, and radiated from the heat sink.

(Structure of Condensation Portion)

Next, production of the nanomaterial on the condenser portion 20 of the heat spreader 10 will be described.

Figure 7:
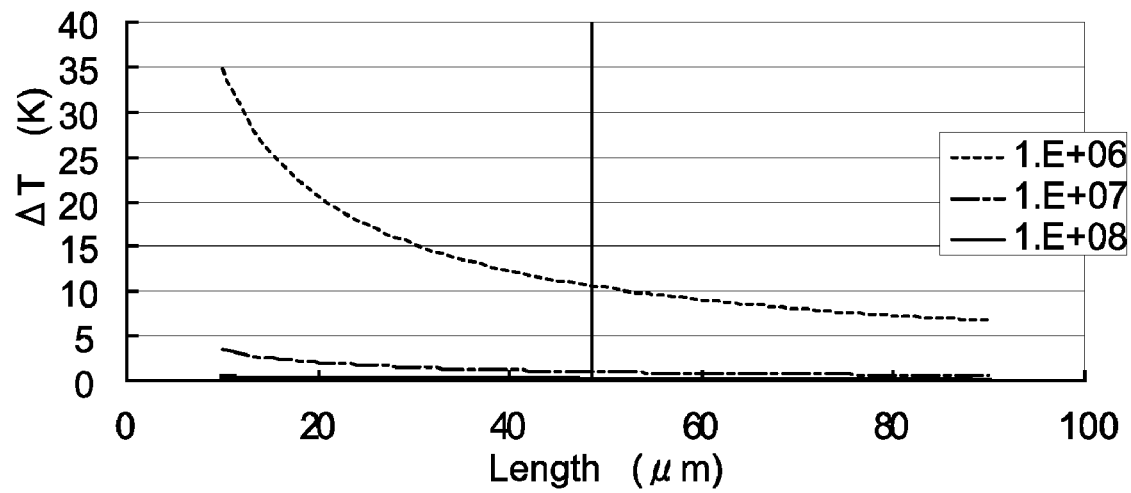
FIG. 7 is a graph showing the result of simulation of the relationship of length of carbon nanotube and condensation efficiency.

FIG. 7 is a graph showing the result of simulation of the relationship of length of carbon nanotube and condensation efficiency, in the case where the nanomaterial for the condenser portion 20 is carbon nanotube. The condensation efficiency is evaluated by $\Delta T$ obtained by average condensation thermal conductance. Generally-used Nusselt liquid-film theory is employed. In FIG. 7, abscissa is length (μm) of carbon nanotube, and ordinate is $\Delta T$ (K) obtained by average condensation thermal conductance. Density (1/cm$^2$) of carbon nanotube is a variable.

Figure 8:
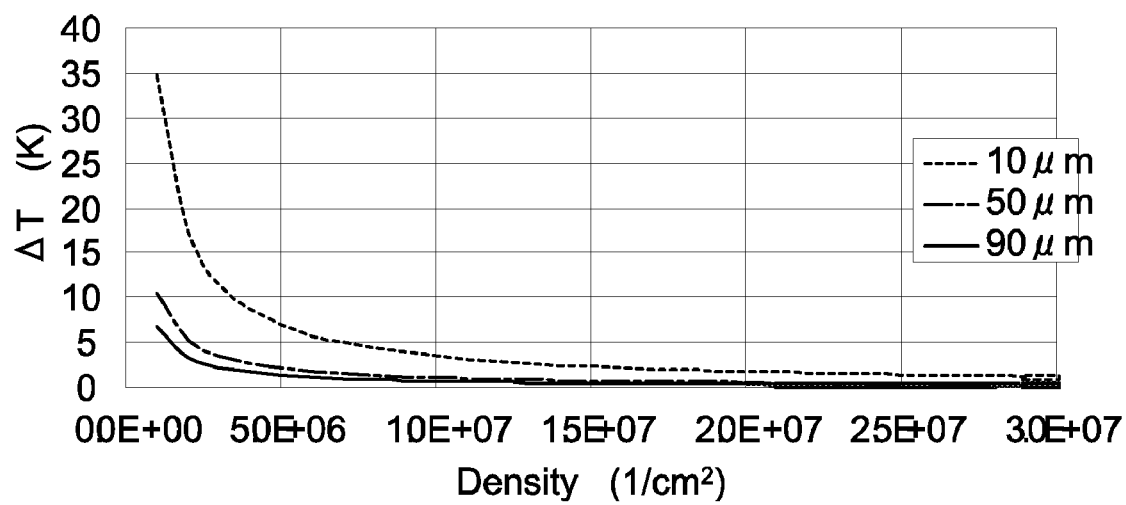
FIG. 8 is a graph showing the result of simulation of the relationship of density of carbon nanotube and condensation efficiency.

FIG. 8 is a graph showing the result of simulation of the relationship of density of carbon nanotube and condensation efficiency, in the case where the nanomaterial for the condenser portion 20 is carbon nanotube. Abscissa is density (1/cm$^2$) of carbon nanotube, and ordinate is $\Delta T$ (K) obtained by average condensation thermal conductance. Length (μm) of carbon nanotube is a variable.

The graphs of FIGS. 7 and 8 are obtained by the following expressions (1)-(9).

Table 1 shows parameters in the following expressions.

TABLE 1

| | |
|---|---|
| $Re_\delta$: | Film Reynolds number |
| $\delta$: | Liquid film thickness |
| $u_m$: | Average flow rate in liquid film |
| $v_l$: | Kinetic viscosity |
| $h_x$: | Local heat transfer coefficient |
| $k_l$: | Thermal conductance |
| $T_{sat}$: | Saturation temperature |
| $T_w$: | Condensation surface temperature |
| $\Delta T$: | $T_{sat} - T_w$ |
| $\rho_l$: | Density |

TABLE 1-continued

| | |
|---|---|
| g: | Acceleration of gravity |
| $L_{lv}$: | Condensation latent heat |
| h: | Average heat transfer coefficient |

As the condensation efficiency (degree of superheat ΔT) using water as refrigerant is smaller, the temperature change in concentration can be smaller. Condensation physical property values of 40° C. are used (Kinetic viscosity: 6.6e-7 m²/s, Density: 993 kg/m³, Thermal conductance: 0.63 W/(mK), Condensation latent heat: 2407 kL/kg). Carbon nanotube having a diameter of 50 nm is produced in an area of 16 cm² to obtain 80 W.

$$Re_\delta \equiv \frac{4\delta u_m}{v_l} \quad (1)$$

$$h_x = \frac{k_l}{\delta} \quad (2)$$

$$\delta = \left(\frac{4k_l v_l (T_{sat} - T_w)x}{\rho_l g L_{lv}}\right)^{\frac{1}{4}} \quad (3)$$

$$u_m = \frac{1}{\delta}\int_0^\delta u_l\,dy = \frac{g\delta^2}{3v_l} \quad (4)$$

$$\overline{h} = \frac{1}{x_0}\int_0^{x_0} h_x\,dx = \frac{4}{3}h_{x=x_0} \quad (5)$$

Expression (3) is substituted into Expression (2) to organize the local heat transfer coefficient, to thereby obtain Expression (6).

$$h_x = k_l^{\frac{3}{4}}\left(\frac{\rho_l g L_{lv}}{4 v_l}\right)^{\frac{1}{4}} \Delta T^{-\frac{1}{4}} x^{-\frac{1}{4}} \quad (6)$$

Expression (6) is substituted into Expression (5), to thereby obtain average heat transfer coefficient as follows.

$$\overline{h} = \frac{4}{3} k_l^{\frac{3}{4}}\left(\frac{\rho_l g L_{lv}}{4 v_l}\right)^{\frac{1}{4}} \Delta T^{-\frac{1}{4}} x^{-\frac{1}{4}} \quad (7)$$

Amount of heat is expressed as follows.

$$Q = A\Delta T \overline{h} \quad (8)$$

Expression (7) is substituted into Expression (8) and organized, to thereby obtain degree of superheat as shown in Expression (9).

$$\Delta T = \frac{1}{k_l}\left(\frac{4 v_l}{\rho_l g L_{lv}}\right)^{\frac{1}{3}} x^{\frac{1}{3}} \left(\frac{3Q}{4A}\right)^{\frac{4}{3}} \quad (9)$$

As shown in the graph of FIG. 7, when the length (μm) of carbon nanotube is larger, ΔT(K) is lower.

Specifically, when the length of carbon nanotube is 50 (μm) or more, the evaluation index is higher.

As shown in the graph of FIG. 8, when the density (1/cm²) of carbon nanotube is higher, ΔT(K) is higher.

Specifically, in the case where the length of carbon nanotube is 50 (μm) or more, when the density of carbon nanotube is 5×10⁶ (1/cm²) or more, the evaluation index is higher.

In view of the above, in the case where carbon nanotube is used as a nanomaterial for the condenser portion 20, carbon nanotube having the length of 50 μm or more may be produced with the density of 5×106 (1/cm2) or more.

(Heat Spreader Manufacturing Method)

Figure 9:
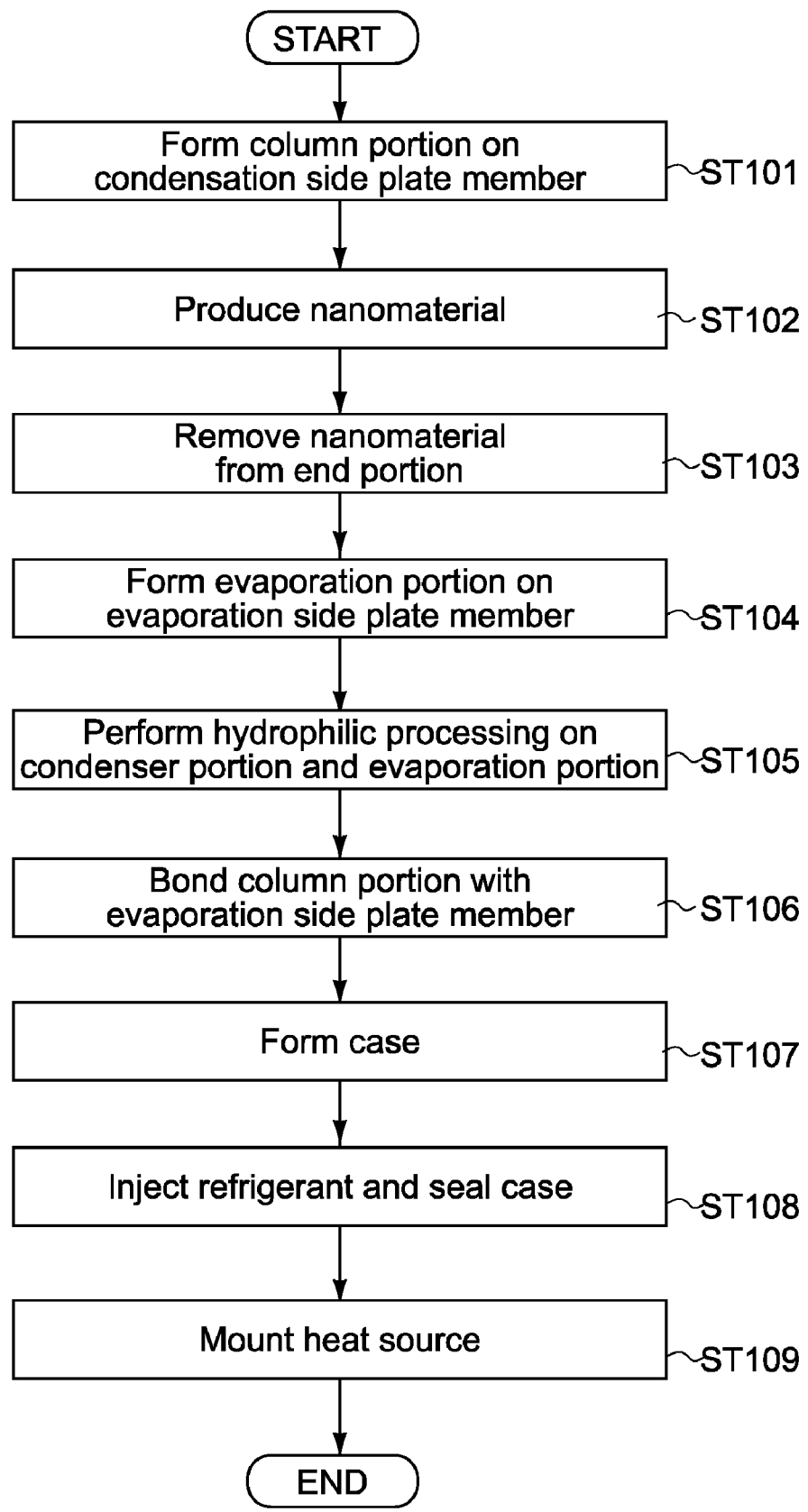
FIG. 9 is a flowchart showing a heat spreader manufacturing method.

Next, an embodiment of a manufacturing method of the heat spreader 10 will be described. FIG. 9 is a flowchart showing the heat spreader manufacturing method. FIG. 10 are schematic diagrams showing the manufacturing method in sequence.

Figure 10A:
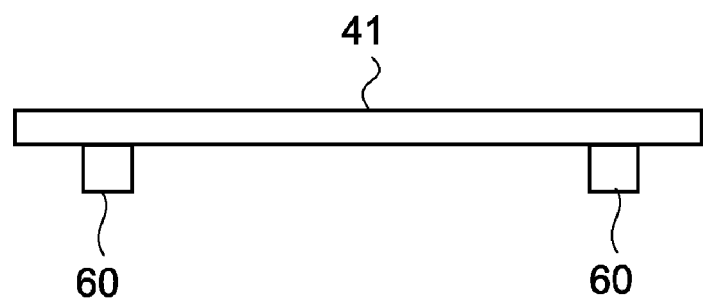
FIG. 10 are schematic diagrams showing the heat spreader manufacturing method in sequence.

As shown in FIG. 10A, the column portions 60 are formed on the condensation side plate member 41 (Step 101). The column portions 60 may be in advance formed with the condensation side plate member 41 as an integrated member. Alternatively, the column portions 60 and the condensation side plate member 41 may be separately formed and then bonded by brazing, that is, welded, or may be bonded with an adhesive material depending on the materials.

Figure 10B:
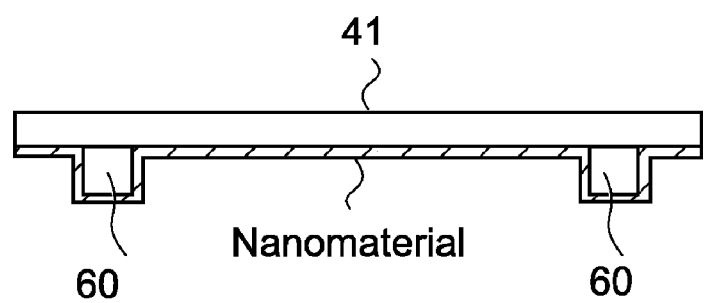

Next, as shown in FIG. 10B, a nanomaterial is produced on the surface of the condensation side plate member 41 provided with the column portions 60, and on the surface of the column portions 60 (side surfaces and end portions 61) (Step 102). Specifically, for example, a not-shown catalyst layer is formed on the surface of the condensation side plate member 41 provided with the column portions 60 and on the surface of the column portions 60. Then, a nanomaterial such as carbon nanotube is densely formed on the catalyst layer such that the tip end portion of the carbon nanotube faces downward. The nanomaterial can be formed on the catalyst layer by plasma CVD (Chemical Vapor Deposition) or thermal CVD, but not limited to the above. The condensation side plate member 41 will later be bonded with the side plate member 43. So, the bond area of the condensation side plate member 41 is in advance masked and the nanomaterial is not produced in this area.

Figure 10C:
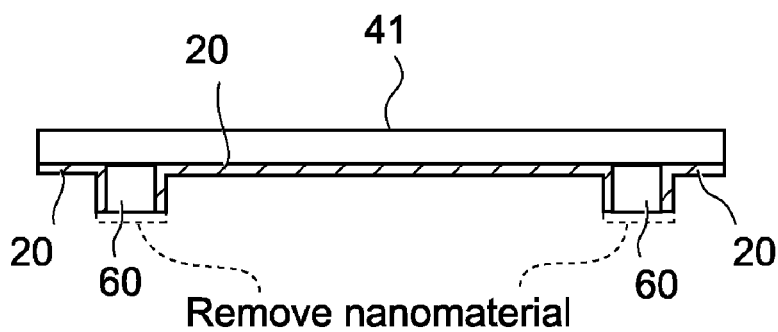

Next, as shown in FIG. 10C, the nanomaterial produced on the end portions 61 of the column portions 60 is removed (Step 103). The nanomaterial is removed by polishing for example. Accordingly, the end portions 61 of the column portions 60, that is, base material surfaces, are exposed and the unremoved nanomaterial forms the condenser portion 20. As shown in FIG. 10C, the distance between the end portions 61 and the condensation side plate member 41 is the same as the distance between the lower end surface of the condenser portion 20 and the condensation side plate member 41.

Next, the evaporation portion 70 made of a nanomaterial is formed on the evaporation side plate member 42 (Step 104). Specifically, a predetermined area on one surface of the evaporation side plate member 42 is masked or the like. In the masked area, the column portions 60 and the side plate members 43 to be bonded later and tolerance are at least included. Next, a not-shown catalyst layer is formed on the evaporation side plate member 42, the predetermined area of which is masked. A nanomaterial such as carbon nanotube is densely formed on the catalyst layer. The nanomaterial can be formed on the catalyst layer by plasma CVD (Chemical Vapor Deposition) or thermal CVD, but not limited to the above. The evaporation portion 70 is thus formed in the desired area of the evaporation side plate member 42. The base material is exposed in the area where the evaporation portion 70 is not formed.

Next, the condenser portion 20 and the evaporation portion 70 are subjected to a hydrophilic processing (Step 105). The hydrophilic processing may be for example nitric acid processing for generating a carboxyl group or ultraviolet radiation, performed on the nanomaterial as the condenser portion 20 and the evaporation portion 70.

Note that the order of the manufacturing steps may be arbitrarily changed. For example, after the formation of the evaporation portion 70 on the evaporation side plate member 42 (Step 104), the column portions 60 and the condenser portion 20 may be formed on the condensation side plate member 41 (Steps 101-103). Alternatively, after the formation of the condenser portion 20 (Steps 101-103), the condenser portion 20 may be subjected to the hydrophilic processing (Step 105). After the formation of the evaporation portion 70 (Step 104), the evaporation portion 70 may be subjected to the hydrophilic processing (Step 105). The order of the manufacturing steps is not limited to the above-mentioned examples.

Next, the end portions 61 of the column portions 60 are bonded with the area of the evaporation side plate member 42 where the evaporation portion 70 is not formed (Step 106). The end portions 61 of the column portions 60 and the evaporation side plate member 42 may be bonded by brazing, that is, welded, or may be bonded with an adhesive material depending on the materials.

Next, the condensation side plate member 41, the evaporation side plate member 42, and the side plate member 43 are bonded liquid-tightly to form the case 40 (Step 107). The respective plate members may be bonded by brazing, that is, welded, or may be bonded with an adhesive material depending on the materials. In the bonding, the respective plate members are precisely aligned. Accordingly, in the inner space of the case 40, the condenser portion 20, the flow path 30, the column portions 60, and the evaporation portion 70 are formed.

Next, the refrigerant is injected into the case 40 and the case 40 is sealed (Step 108). FIG. 11 are schematic diagrams showing in sequence the injection method of the refrigerant into the case 40. The case 40 includes an injection port 44 and an injection path 45. The injection port 44 and the injection path 45 are provided to the evaporation side plate member 42, for example, but not limited to the above.

Figure 11A:
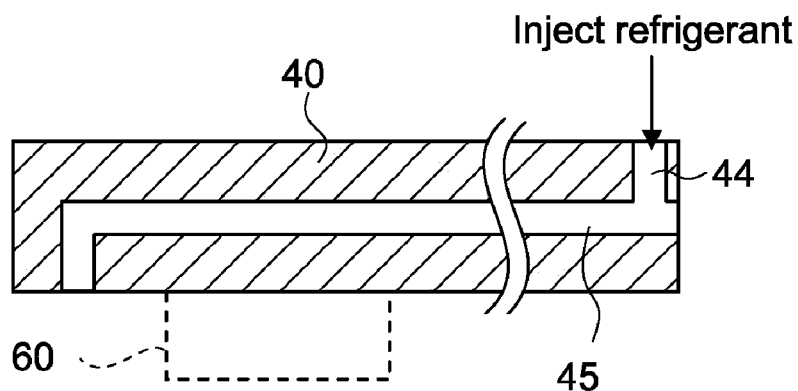
FIG. 11 are schematic diagrams showing in sequence an injection method of a refrigerant into a case of the heat spreader.

As shown in FIG. 11A, the pressure of the inner space of the case 40 is decreased via the injection port 44 and the injection path 45, for example, and the refrigerant is infused into the inner space from a not-shown dispenser via the injection port 44 and the injection path 45.

Figure 11B:
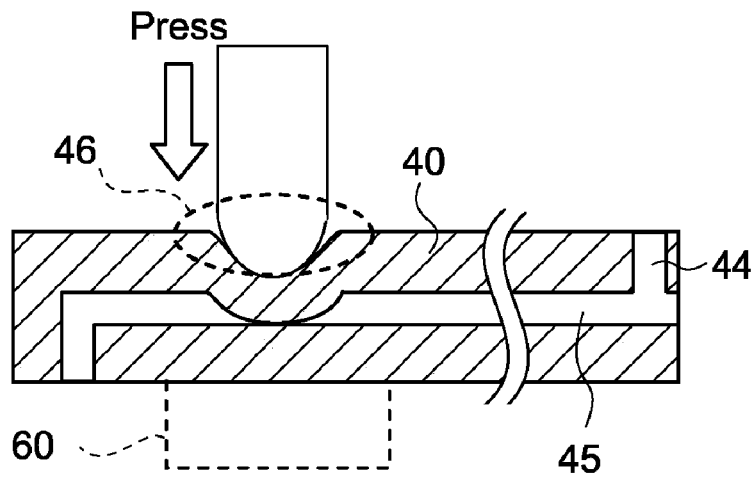

As shown in FIG. 11B, a press area 46 is pressed and the injection path 45 is closed (temporal sealing). The pressure of the inner space of the case 40 is decreased via another injection path 45 and another injection port 44, and when the pressure of the inner space of the case 40 reaches a target pressure, the press area 46 is pressed and the injection path 45 is closed (temporal sealing). The position of the press area 46 corresponds to the column portion 60 formed in the case 40.

Figure 11C:
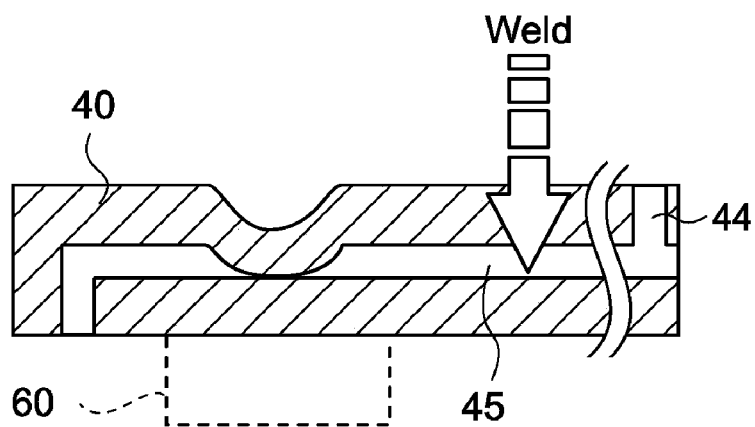

As shown in FIG. 11C, on a side closer to the injection port 44 than the press area 46, the injection path 45 is closed by laser welding for example (final sealing). Accordingly, the inner space of the heat spreader 10 is sealed tightly. By infusing the refrigerant into the inner space of the case 40 and sealing the case 40 as described above, the heat spreader 10 is manufactured. Note that the production of the nanomaterial or the hydrophilic processing in the evaporation portion may only be executed if necessary.

Next, the heat source 50 is mounted in a position of the evaporation side plate member 42, corresponding to the evaporation portion 70 (Step 109). In a case where the heat source 50 is a CPU, the process is for example a reflow soldering processing.

The reflow processing and the manufacturing processing of the heat spreader 10 may be executed in different areas (for example different factories). So, in the case of executing the infusion of the refrigerant after the reflow processing, it is necessary to transport the heat spreader 10 to and from the factories, which leads to problems of cost, manpower, time, or generation of particles of the transfer between factories. According to the manufacturing method of FIG. 9, it is possible to execute the reflow processing after the completion of the heat spreader 10, solving the above problem.

According to the heat spreader manufacturing method of this embodiment, in Steps 101 and 102, after the formation of the column portions 60 on the condensation side plate member 41, the condenser portion 20 made of a nanomaterial is formed. Assuming a case where the condenser portion 20 is formed on the condensation side plate member 41 and then the column portions 60 are formed, the bond areas for the column portions 60 and the condensation side plate member 41 including tolerance are in advance masked, to form the condenser portion 20. However, according to this embodiment, after the formation of the column portions 60 on the condensation side plate member 41, the condenser portion 20 made of a nanomaterial is formed. So, the condenser portion 20 can be formed on the entire area of the inner surface of the condensation side plate member 41 and the surface of the column portions 60. Accordingly, the surface area of the condenser portion 20 can be increased, and the condensation efficiency becomes higher.

Figure 12A:
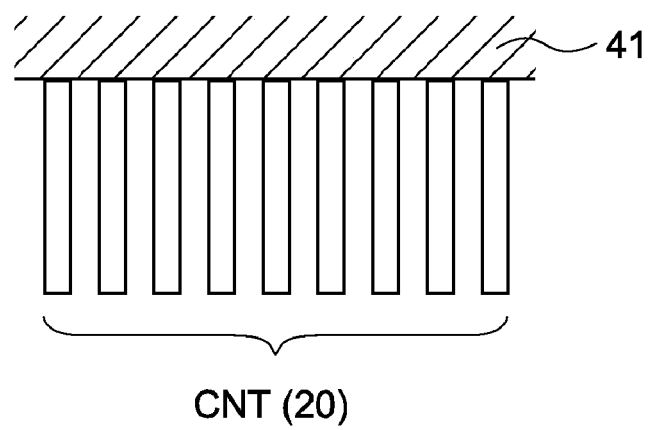
FIG. 12A is a schematic diagram showing production of carbon nanotube having a tip end portion facing downward.
Figure 12B:
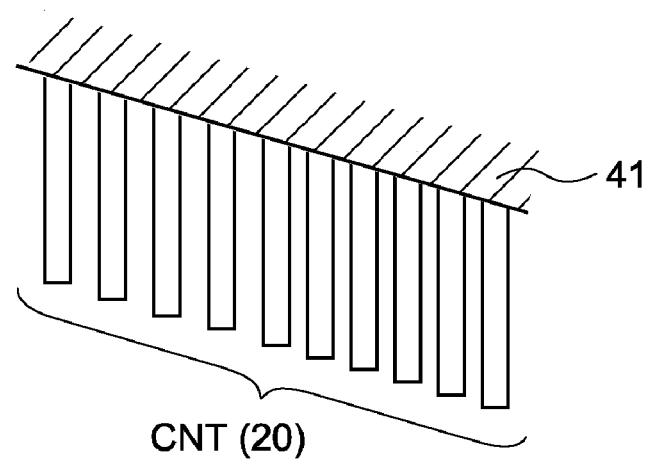
FIG. 12B is a schematic diagram showing the production of the carbon nanotube having the tip end portion facing downward in a case where a condensation side plate member is arranged to be tilted.
Figure 12C:
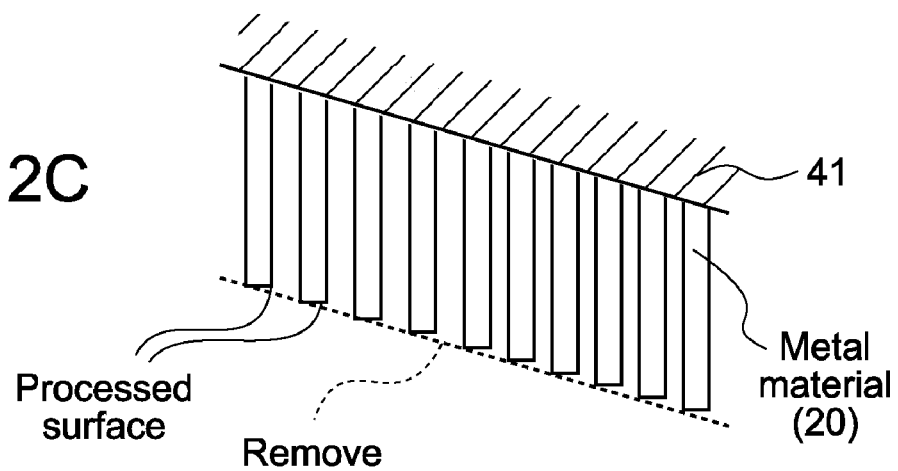
FIG. 12C is a schematic diagram showing a condenser portion made of a metal material in a case where the condensation side plate member is arranged to be tilted.

In Step 102, the carbon nanotube is produced such that the tip end portion of the carbon nanotube faces downward. FIG. 12A is a schematic diagram showing the production of the carbon nanotube. Because carbon nanotube has a high orientation, it is easy to produce the carbon nanotube such that the tip end portion faces downward. Accordingly, the flow efficiency of the working fluid by gravity is enhanced. So, as shown in FIG. 12B, when the condensation side plate member 41 is arranged to be tilted, it is easy to produce the carbon nanotube such that the tip end portion faces downward (direction of gravity). Thus, the condenser portion 20 can be easily manufactured with higher reliability. It is assumed that the condenser portion 20 has rectangular grooves made of a metal material when the condensation side plate member 41 is arranged to be tilted. In a case of causing the liquid refrigerant to flow vertically, the condenser portion 20 is preferably be vertically formed in parallel as shown in FIG. 12C. When the condenser portion 20 is made of a metal material, it is necessary to, for example, cut the metal material, which makes the manufacture of the condenser portion 20 complicated and lowers reliability.

In Step 103, the end portions 61 of the column portions 60 may be exposed by polishing. The heat spreader 10 is thus easily manufactured with higher reliability.

In Step 104, the production area of the nanomaterial is restricted by previously masking the predetermined area. Thus, the evaporation portion 70 can be easily manufactured with higher reliability.

In Step 106, the surfaces of the base materials on which no nanomaterial is produced are bonded with each other. So, higher contact property is obtained compared to the case where a nanomaterial has produced. Thus, the case 40 can be manufactured with higher reliability, and the structural strength of the case 40 can be increased.

In Step 108, the position of the press area 46 corresponds to the position of the column portion 60 formed inside the case 40. So, the case 40 can be prevented from being crushed and closed owing to the pressure force when being pressed, that is, caulked. Accordingly, the strength of the case 40 can be increased.

(Example of Electric Apparatus)

Figure 13:
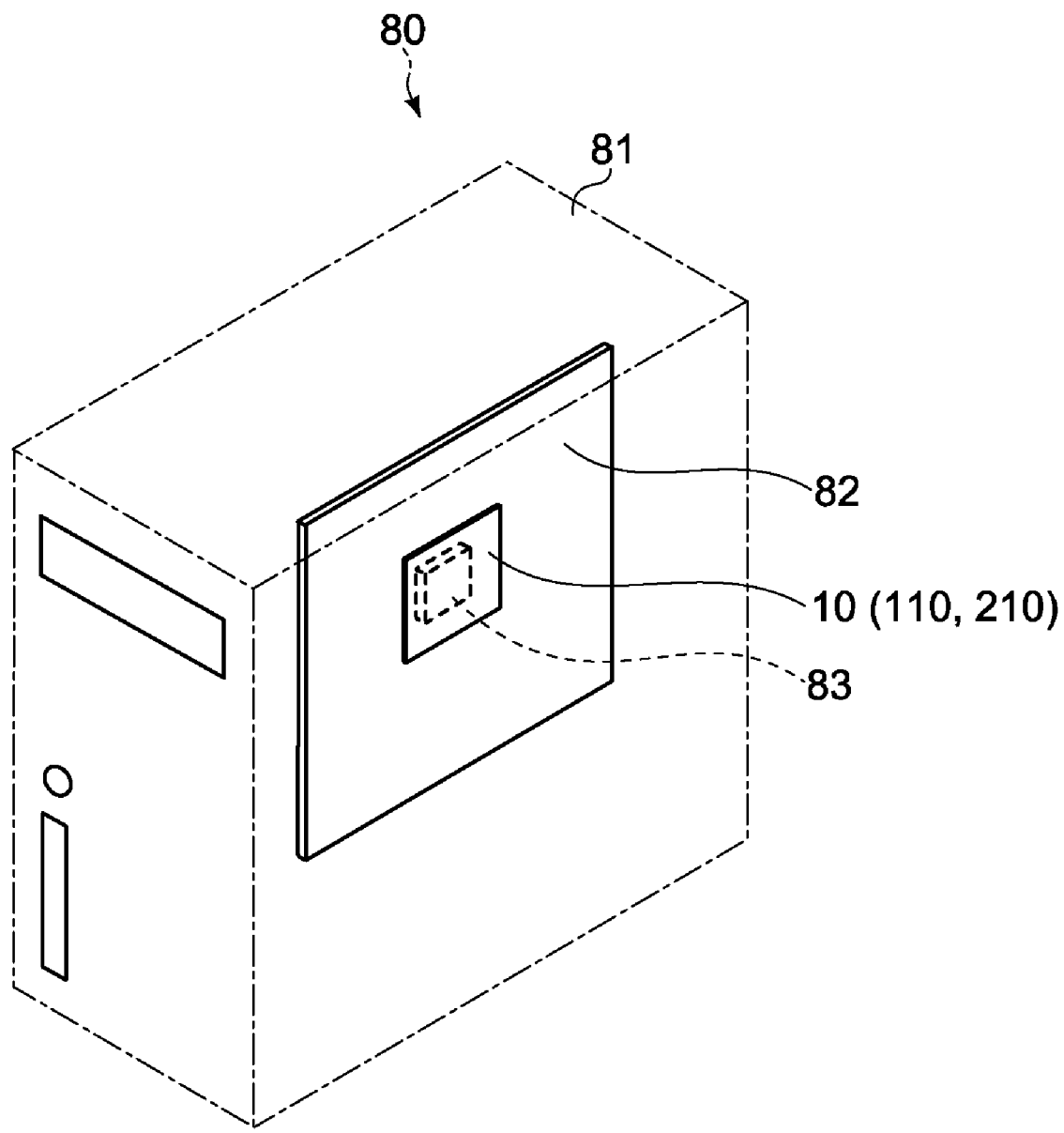
FIG. 13 is a perspective view showing a desktop PC as an electronic apparatus including the heat spreader.

FIG. 13 is a perspective view showing a desktop PC as an electronic apparatus including the heat spreader 10. In a case 81 of a PC 80, a circuit board 82 is provided, and a CPU 83 for example is mounted on the circuit board 82. The CPU 83 as a heat source is thermally connected with the heat spreader 10, and the heat spreader 10 is thermally connected with a not-shown heat sink.

In the example of the figure, the CPU 83 is thermally connected substantially in a center portion of the evaporation side plate member 42 of the heat spreader 10. The heat spreader 10 is arranged substantially vertically. Although not shown, the heat spreader 10 may be arranged substantially horizontally.

The embodiment according to the present application is not limited to the embodiment described above, and various modifications are conceivable.

The shape of the heat spreader 10 is rectangular. However, the shape of the heat spreader 10 may be circular, ellipsoidal, polygonal, or another arbitrary shape. The shape of the column portion 60, the evaporation portion 70, or the like may also be arbitrarily changed.

As an electronic apparatus, the desktop PC of FIG. 13 is exemplarily shown. However, the present application is not limited to the above, as an electronic apparatus, a PDA (Personal Digital Assistance), an electronic dictionary, a camera, a display apparatus, an audio/visual apparatus, a projector, a mobile phone, a game apparatus, a car navigation apparatus, a robot apparatus, a laser generation apparatus, or another electronic appliance may be employed.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The application is claimed as follows:

1. A heat spreader, comprising:
 a condenser portion formed of an elongated nanomaterial having tip end portions arranged on an upper surface of the heat spreader; and
 an evaporation portion formed of a nanomaterial and positioned on a lower surface of the heat spreader opposite to the condenser portion with a flow path gap between the condenser portion and the evaporation portion,
 wherein the elongated nanomaterial is vertically arranged in parallel on the upper surface of the heat spreader such that the tip end portions of the nanomaterial face downward toward the lower surface of the heat spreader, and
 wherein the condenser portion has been subjected to hydrophilic processing, and the elongated nanomaterial has a hydrophobic property.

2. The heat spreader according to claim 1, further comprising:
 a first plate member that includes a first surface as the upper surface, the first surface including a first area provided with the condenser portion;
 a second plate member that includes a second surface that is the lower surface and is arranged such that the second surface faces the first surface; and
 a support portion that protruding from the first plate member to the second plate member, and having an end portion that is free from the nanomaterial and is in contact with the second surface of the second plate member.

3. The heat spreader according to claim 2,
 wherein the second surface of the second plate member has a second area and a third area, the second area being provided with the evaporation portion, the third area excluding the second area, and
 wherein the end portion of the support portion is in contact with the third area of the second surface.

4. The heat spreader according to claim 3,
 wherein the first plate member is arranged in a first position,
 wherein the second plate member is arranged in a second position that is lower than the first position, and
 wherein the nanomaterial forming the condenser portion is carbon nanotubes having the tip end portions facing downward toward the second plate member.

5. The heat spreader according to claim 1, wherein the density of the carbon nanotubes is $5 \times 10^6$ ($1/cm^2$).

6. The heat spreader according to claim 1, wherein an average length of the carbon nanotubes ranges from about 50 to 90 μm.

7. The heat spreader according to claim 1, wherein the nanomaterial of the evaporation portion is carbon nanotubes.

8. The heat spreader according to claim 1, wherein the evaporation portion is formed in a center of the lower surface of the heat spreader.

9. The heat spreader according to claim 8, wherein column portions are arranged around the outside of the evaporation portion, and are arranged to extend between the upper surface of the heat spreader and the lower surface of the heat spreader.

10. The heat spreader according to claim 9, wherein the column portions are formed on the upper surface of the condenser portion, and each column portion has an end portion extending to and contacting the lower surface of the heat spreader.

11. The heat spreader according to claim 1, wherein a portion of the upper surface of the heat spreader is arranged perpendicularly with respect to the vertical downward direction of the nanomaterial.

12. The heat spreader according to claim 1, wherein a portion of the upper surface of the heat spreader is tilted with respect to the vertical downward direction of the nanomaterial.

13. An electronic apparatus, comprising:
 a heat source; and
 a heat spreader that is thermally connected to the heat source and includes
 a condenser portion formed of an elongated nanomaterial having tip end portions arranged on an upper surface of the heat spreader, and
 an evaporation portion formed of a nanomaterial and positioned on a lower surface of the heat spreader opposite to the condenser portion with a flow path gap between the condenser portion and the evaporation portion,
 wherein the elongated nanomaterial is vertically arranged in parallel on the upper surface of the heat spreader such that the tip end portions of the nanomaterial face downward toward a lower surface of the heat spreader, and
 wherein the condenser portion has been subjected to hydrophilic processing, and the elongated nanomaterial has a hydrophobic property.

14. The electronic apparatus according to claim 13,
 wherein the heat spreader further includes a support portion, a first plate member, and a second plate member, the first plate member including a first surface that is the upper surface, the first surface including a first area provided with the condenser portion, the second plate member including a second surface that is the lower surface and is arranged such that the second surface faces the first surface, the support portion protruding from the first area of the first plate member to the second plate member and having an end portion that is free from the nanomaterial and is in contact with the second surface of the second plate member.

15. A heat spreader manufacturing method, comprising:

preparing a first plate member having a first area provided on an upper surface of the first plate member and provided with a protrusion portion;

producing an elongated nanomaterial having tip end portions in the first area provided with the protrusion portion;

removing the nanomaterial that has been produced in an end portion of the protrusion portion, thus leaving the nanomaterial on at least the upper surface of the first plate member;

preparing a second plate member formed of a nanomaterial and formed in a second area on a lower surface of the heat spreader opposite to the first plate member with a flow path gap between the first plate member and the second plate member; and causing the end portion of the protrusion portion to contact with the second area of the second plate member, wherein the elongated nanomaterial is vertically arranged in parallel on the upper surface of the heat spreader such that the tip end portions of the nanomaterial face downward toward the lower surface of the second plate member, and wherein the first plate member has been subjected to hydrophilic processing, and the elongated nanomaterial has a hydrophobic property.

16. The heat spreader manufacturing method according to claim 15, further comprising producing a nanomaterial in a third area of the lower surface of the second plate member, the lower surface being in contact with the end portion of the protrusion portion, the third area excluding the second area of the lower surface.

17. The heat spreader manufacturing method according to claim 15, wherein the nanomaterial is carbon nanotubes, wherein the first plate member is arranged in a first position, wherein the second plate member is arranged in a second position lower than the first position, and wherein the carbon nanotubes are produced such that the tip end portions of the carbon nanotubes face the lower surface of the second plate member.

\* \* \* \* \*